United States Patent [19]
Osanai

[11] Patent Number: 5,126,649
[45] Date of Patent: Jun. 30, 1992

[54] CHARGE DETECTING APPARATUS

[75] Inventor: Katsutoyo Osanai, Nagaokakyo, Japan

[73] Assignee: Shimadzu Corporation, Kyoto, Japan

[21] Appl. No.: 672,803

[22] Filed: Mar. 21, 1991

[30] Foreign Application Priority Data

Apr. 10, 1990 [JP] Japan .................. 2-95420

[51] Int. Cl.[5] .................................. H02J 7/04
[52] U.S. Cl. .................................. 320/46; 320/48
[58] Field of Search .................. 320/43, 46, 48

[56] References Cited

U.S. PATENT DOCUMENTS

| | | | |
|---|---|---|---|
| 3,548,286 | 12/1970 | Giacalone et al. | 320/46 X |
| 3,584,285 | 6/1971 | Goodkin | 320/46 |
| 3,652,915 | 3/1972 | Eberts | 320/46 X |
| 3,781,751 | 12/1973 | Sulger, Sr. | 320/46 X |
| 3,987,353 | 10/1976 | Macharg | 320/46 X |
| 4,034,279 | 7/1977 | Nilsson | 320/46 X |
| 4,366,431 | 12/1982 | Santini | 320/46 |
| 4,388,583 | 6/1983 | Krueger | 320/46 |
| 4,551,667 | 11/1985 | McAuliffe | 320/46 |

Primary Examiner—Steven L. Stephan
Assistant Examiner—Kristine Peckman
Attorney, Agent, or Firm—Armstrong, Nikaido, Marmelstein, Kubovcik & Murray

[57] ABSTRACT

A charge detecting apparatus for detecting completion of charging of a secondary battery using electrolyte. Bubbling sounds produced inside the secondary battery being charged are detected outside a container of the battery and converted into a quantity of electricity. A charge completion signal is output when the quantity of electricity reaches a predetermined reference level.

5 Claims, 4 Drawing Sheets

CHARGE DETECTING APPARATUS

BACKGROUND OF THE INVENTION (1) Field of the Invention

The present invention relates to a charge detecting apparatus for detecting charge completion time when charging a secondary battery in which a electrolyte is used.

(2) Description of the Related Art

Conventional methods of charging secondary batteries are broadly classified into constant-voltage charging and constant-current charging. Methods of detecting charge completion time include detection of terminal voltage, detection of terminal voltage variations and detection of a battery internal pressure.

The constant-voltage charging is not suited for rapid charging in that, although a battery may be charged by means of a large quantity of current in an initial stage of charging, only a small quantity of current may be used in later stages. The method suited for rapid charging is the constant-current charging which allows a large and constant quantity of current to be supplied from beginning to end of charging.

However, the constant-current charging always requires some means to prevent an overcharge. It is therefore necessary to check whether a battery is fully charged or not. Broadly, there are the following three methods for determining the fully charged state of a battery:

(1) "Terminal Voltage Detection"

This is a method in which charging is regarded as being completed when the terminal voltage of a battery being charged reaches a predetermined level.

(2) "Detection of Terminal Voltage Variations"

This method detects a voltage between the terminals of a secondary battery, and charging is regarded as being completed when the gradient (time variation rate) of this voltage reaches a predetermined level.

(3) "Detection of Battery Internal Pressure"

This method utilizes bubbles produced internally of a battery when charging is completed, and charging is regarded as being completed when the internal gas pressure of a battery having a special, enclosed structure reaches a predetermined level.

Features of these methods will be described hereunder.

Terminal Voltage Detection

The voltage between the terminals of a secondary battery is greatly influenced by the temperature of the battery during charging. FIG. 1 shows temperature characteristics of the voltage between the terminals of a lead storage battery. The horizontal axis represents charging time.

At charge completion time T0, the voltage between the terminals shows a sharp rise when the battery temperature is low, and the increase becomes moderate with increases in the battery temperature. Thus, a reference level for determining charge completion must be adjusted in accordance with the battery temperature. Difficulties are encountered particularly when the battery temperature is high since the reference level must be set strictly.

In the case of a charger having a built-in temperature sensor, the reference level may be set on the basis of a temperature detected by this temperature sensor. However, temperatures of the battery and charger may be different, whereby the reference level set could be grossly inappropriate.

With an incorrect adjustment of the reference level for determining the voltage between the terminals, charging may be continued after the charge completion time T0. This results in an overcharge which not only overheats the battery but adds difficulty to correct detection of the charge completion time T0. If the charging is allowed to continue, the electrolyte in the battery undergoes electrolysis to be released as hydrogen gas and oxygen gas. As a result, the battery may lose its function altogether.

Detection of Battery Internal Pressure

In utilizing bubbling that takes place inside a battery at charge completion time, it is necessary to set a pressure sensor inside the battery and seal the entire battery tight. Since a battery having such a special structure is required, this method is little used in practice.

Generally, the bubbling is visually monitored instead of detecting the internal pressure, and charging is stopped upon detection of a predetermined quantity of bubbles. However, this method is limited to batteries mounted in transparent containers such as car batteries whose interiors may be observed from outside, and is not applicable to lead storage batteries, nickel-cadmium batteries or alkaline storage batteries encased in opaque containers.

SUMMARY OF THE INVENTION

The present invention has been made having regard to the state of the art noted above, and its object is to provide a charge detecting apparatus capable of detecting charge completion time relatively simply and correctly regardless of types of secondary batteries and without the influences of temperature variations.

The above object is fulfilled, according to the present invention, by a charge detecting apparatus for detecting completion of charging of a secondary battery in which an electrolyte is used, the apparatus comprising;

a bubbling sound detecting device for picking up, with a microphone or the like externally of a container of the secondary battery, bubbling sounds produced inside the secondary battery, and converting the bubbling sounds into a quantity of electricity, and a bubble quantity checking device for outputting a charge completion signal when the quantity of electricity output from the bubbling sound detecting device reaches a predetermined reference level.

The present invention performs the following functions:

(1) The bubbling sound detecting device is disposed outwardly of the container of a secondary battery for detecting bubbling sounds produced inside the secondary battery. It is therefore unnecessary to set a bubbling sound detecting microphone inside the battery or for an entire battery to have a tight-sealed structure as required in the known method of detecting the internal pressure of a battery described hereinbefore. Further, the secondary battery need not be mounted in a transparent container as required in visual confirmation of bubbling. The present invention is applicable to various types of batteries including open type lead storage batteries, enclosed lead storage batteries, nickel-cadmium batteries and alkaline storage batteries as long as bubbles are formed therein near charge completion time.

(2) The bubble quantity checking device outputs a charge completion signal when the quantity of electricity received from the bubbling sound detecting device reaches a predetermined reference level. This charge completion signal may be used to automatically stop charging or to drive an alarm to notify the operator of completion of the charging.

(3) The time variation rate of bubbling quantity is steady near the charge completion time, little affected by variations in the battery temperature, and yet rises relatively rapidly. Consequently, a great degree of precision is not required of the reference level for enabling the bubble quantity checking device to determine the charge completion time. This feature allows the reference setting arrangement to be simple, and the charge completion time to be detected accurately.

(4) Since the charge completion time of the secondary battery is detected automatically and accurately without the influences of the battery temperature, there is little chance of the electrolyte being exhausted or consumed in a large quantity through the electrolysis caused by an overcharge. Thus, the secondary battery may be charged rapidly with a large quantity of current.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DESCRIPTION OF THE PREFERRED EMBODIMENTS

Embodiments of the present invention will be described in detail hereinafter with reference to the drawings.

Figure 1:
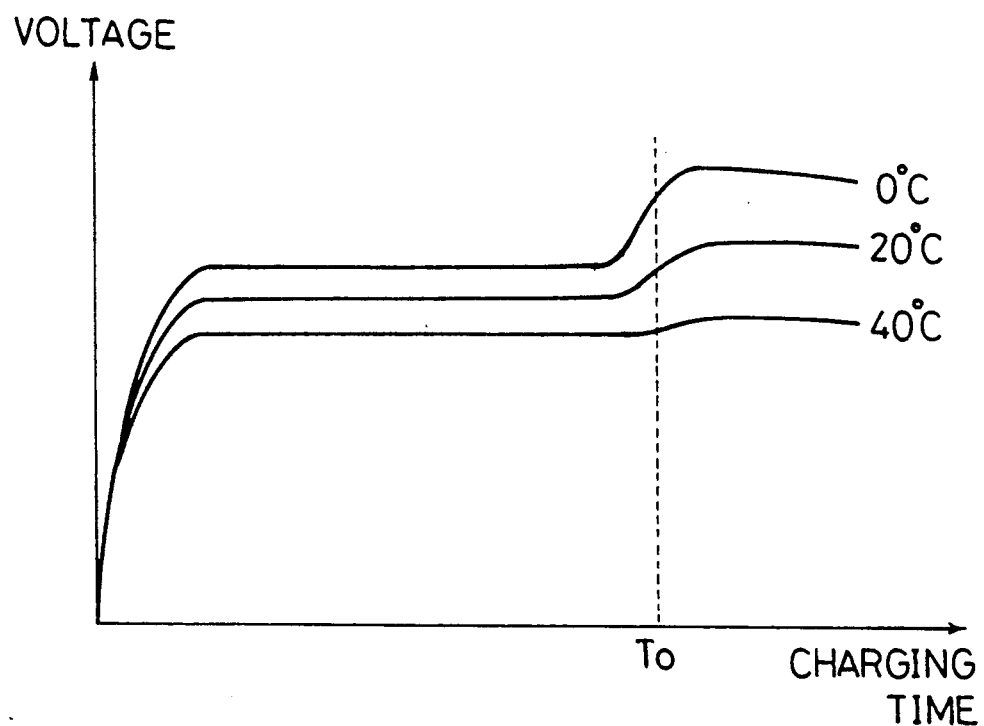
FIG. 1 is a view showing temperature characteristics of a voltage between terminals in a conventional method of detecting the voltage between terminals.
Figure 2:
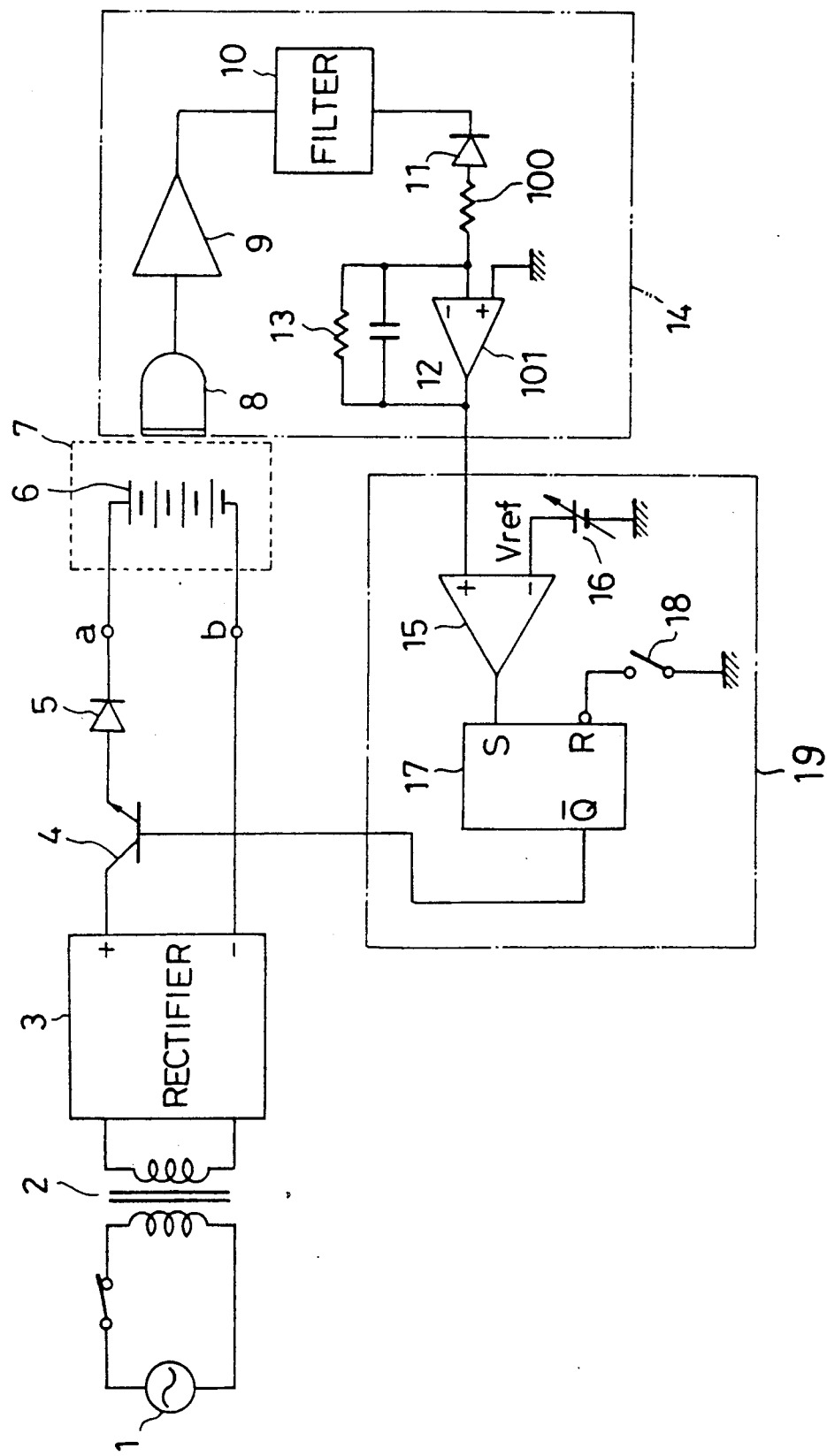
FIG. 2 is a circuit diagram showing, an electric construction of a charge detecting apparatus in one embodiment of the present invention (an example of nickel-cadmium batteries)

FIG. 2 is a circuit diagram showing a charge detecting apparatus embodying the present invention.

In FIG. 2, numeral 1 denotes a commercial power source, numeral 2 a transformer, and numeral 3 a rectifier including a diode bridge and a smoothing capacitor for effecting full-wave rectification. The collector of an NPN-type switching transistor 4 is connected to a positive terminal of the rectifier 3. The emitter of the transistor 4 is connected to one charging terminal a through a reverse flow checking diode 5. The other charging terminal b is connected to a negative terminal of the rectifier 3. The two terminals of a secondary battery 6 are connected to the charging terminals a and b.

With the secondary battery 6 connected in this way, an electrostatic microphone 8, for example, is placed in contact with an outside position of a container 7 containing the secondary battery 6 for picking up bubbling sounds produced inside the secondary battery 6. The electrostatic microphone 8 is attached peripherally of the container 7 through a suction cup having a sound absorbing function, for example. The bubbling sounds are picked up preferably with the secondary battery 6 carrying the electrostatic microphone 8 and mounted in a box which is effective to shut off ambient noise.

The electrostatic microphone 8 is connected to an amplifier 9 which is connected to a filter 10. The filter 10 is followed by a rectifying device, e.g. a rectifying diode 11 and a resistor 100. Further, an integrating circuit acting as a smoothing device is connected, which includes an operational amplifier 101, an integrating capacitor 12 and a discharge resistor 13.

The electrostatic microphone 8, amplifier 9, filter 10, rectifying diode 11, resistor 100, integrating capacitor 12, operational amplifier 101 and discharge resistor 13 constitute a bubbling sound detecting device 14.

An output of the operational amplifier 101 in the bubbling sound detecting device 14 is connected to a non-inversion input terminal (+) of a comparator 15. An inversion input terminal (−) of the comparator 15 is connected to a voltage variable reference source 16 which produces a reference voltage Vref. An output terminal of the comparator 15 is connected to a set input terminal S of a flip-flop 17. A reset input terminal R of the flip-flop 17 is grounded through a reset switch 18. A $\overline{Q}$ output terminal of the flip-flop 17 is connected to the base of the switching transistor 4. The comparator 15, reference source 16, flip-flop 17 and reset switch 18 constitute a bubble quantity checking device 19.

The way in which the charge detecting apparatus as constructed above operates will be described next The reference voltage Vref of the reference source 16 for setting to the comparator 15 in the bubble quantity checking device 19 is predetermined to correspond to an output voltage of the integrating capacitor 12 occurring at charge completion time and in accordance with the type, capacity and the like of the secondary battery 6 to be charged.

When starting a charging operation, the reset switch 18 of the flip-flop 17 is temporarily turned on to place the $\overline{Q}$ output terminal of the flip-flop 17 in "H" level. As a result, the switching transistor 4 becomes conductive to start charging the secondary battery 6. The reset switch 18 is thereafter turned off but the $\overline{Q}$ output terminal of the flip-flop 17 remains "H" level.

Figure 3:
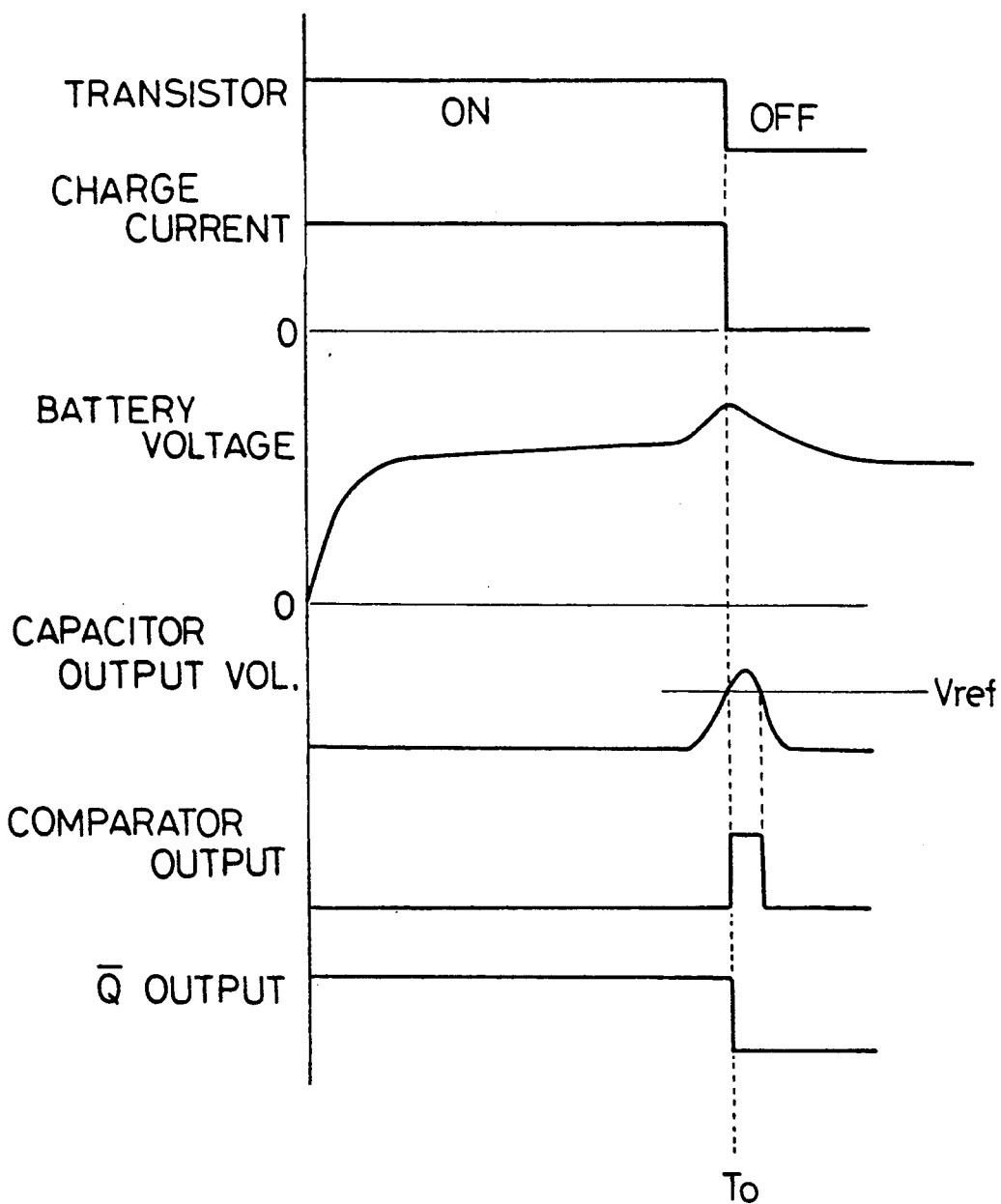
FIG. 3 is a time chart for illustrating operation of the apparatus shown in FIG. 2.

The operation from beginning to end of the charging will be described hereinafter with reference to the time chart of FIG. 3.

The current output from the positive terminal of the rectifier 3 charges the secondary battery 6 by flowing through the switching transistor 4, reverse flow checking diode 5, charging terminal a, secondary battery 6 and charging terminal b to the negative terminal of the rectifier 3. The switching transistor is fully conductive with application of a sufficient base current thereof, to give a sufficiently large value to the charge current for the secondary battery 6. This value is dependent on the secondary output voltage and internal resistance of the transformer 2, voltage drop at the diode 5, voltage of the secondary battery 6 during the charging, and so on. Thus, the value of the charge current may be determined by selecting the internal resistance of the transformer 2. The terminal voltage of the secondary battery 6 gradually increases with progress of charging.

As the charging of the secondary battery 6 draws toward the end, bubbles begin to form inside the secondary battery 6. The bubbling occurs only in trace quantities or sporadically first, which gradually increases and ultimately reaches a great degree of intensity.

The electrostatic microphone 8 of the bubbling sound detecting device 14, placed in contact with the container 7 of the secondary battery 6, effectively picks up the bubbling sounds in the secondary battery 6 and converts the sounds into an electric current. This detection current is amplified by the amplifier 9. Thereafter, the filter 10 extracts only components in a frequency band of the bubbling sounds from the current, discarding frequency components of other sounds. A bubbling sound detection signal emerging from the filter 10 is an AC signal which is rectified by the rectifying diode 11 and resistor 100. This signal is then smoothed and converted into a DC signal by the integrating circuit including the integrating capacitor 12 and operational amplifier 101.

DC output of the operational amplifier 101 increases with the increase in the quantity of bubbles formed. When this output reaches the reference voltage Vref of the reference source 16, the output terminal of the comparator 15 changes from "L" level to "H" level. As a result, the $\overline{Q}$ output terminal of the flip-flop 17 changes from "H" level to "L" level. The "L" level output of the flip-flop 17 is applied as a charge completion signal to the base of the switching transistor 4. Thereupon the switching transistor 4 becomes nonconductive to discontinue the charging of the secondary battery 6.

The quantity of bubbles formed in the secondary battery 6 near the charge completion time T0 is little influenced by the battery temperature. Thus, the increase in the output voltage of the integrating capacitor 12 of the bubbling sound detecting device 14 remains steady regardless of the temperature. This allows the flip-flop 17 of the bubble quantity checking device 19 to output the charge completion signal to the switching transistor 4 with a substantially fixed timing regardless of the battery temperature. This timing, therefore, is valid as representing the charge completion time T0. This means that the secondary battery 6 may be charged with a large quantity of current without being overcharged.

Figure 4:
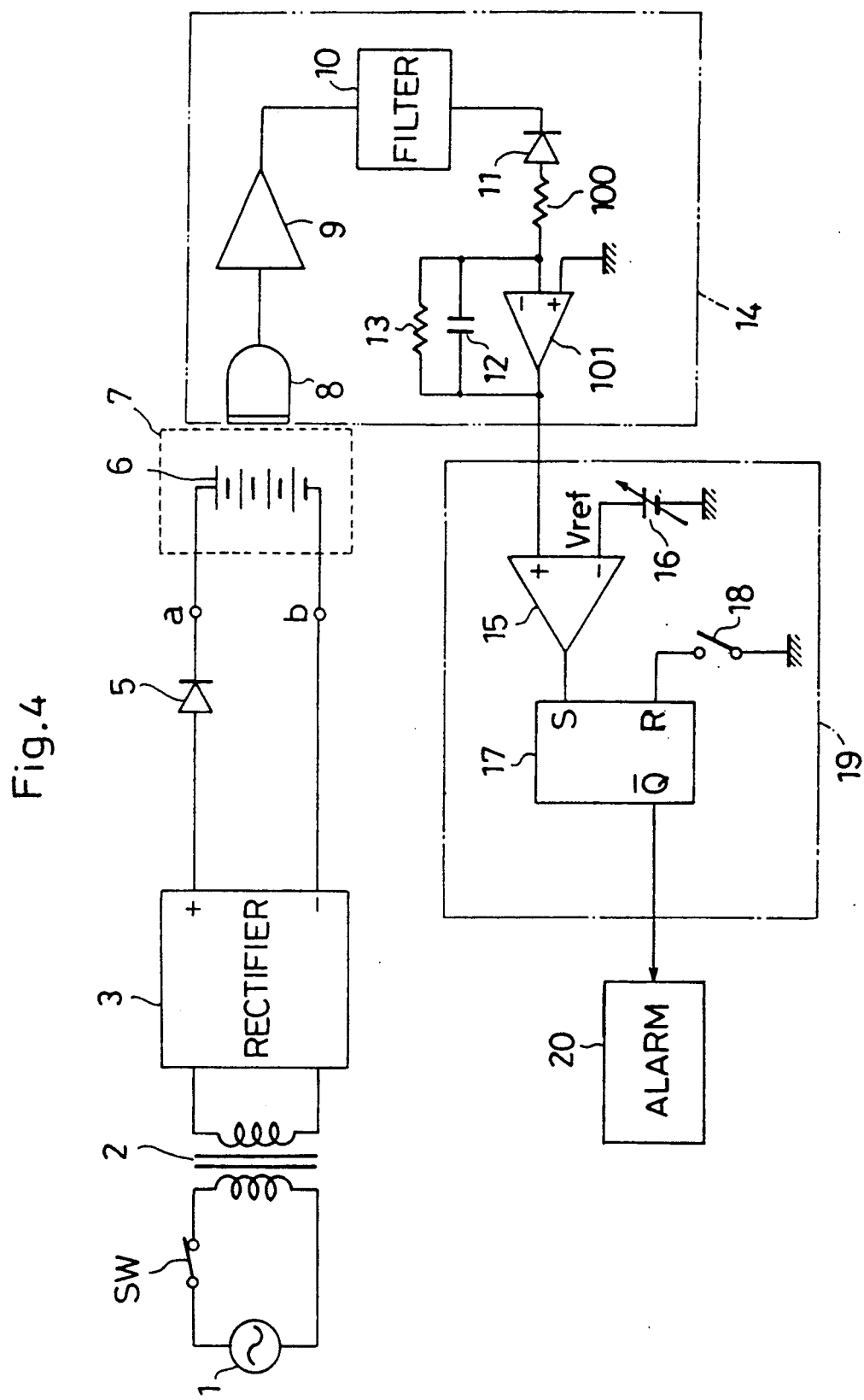
FIG. 4 is a circuit diagram showing an electric construction of a charge detecting apparatus in another embodiment of the present invention.

In the foregoing embodiment, charging is automatically stopped by the charge completion signal applied from the bubble quantity checking device 19 to the switching transistor 4. The present invention is not limited to this construction. As shown in FIG. 4, the charge completion signal may be transmitted to an alarm 20 such as a buzzer or a lamp to operate the alarm 20 for notifying the operator of completion of charging. Then the operator may turn off a source switch SW of the commercial power source 1 to stop the charging of the secondary battery 6.

An alarm as shown in FIG. 4 may be added to the charge detecting apparatus shown in FIG. 2, whereby the charging current is cut upon completion of charging and at the same time the alarm is operated to notify the operator of the completion.

The present invention may be embodied in other specific forms without departing from the spirit or essential attributes thereof and, accordingly, reference should be made to the appended claims, rather than to the foregoing specification, as indicating the scope of the invention.

What is claimed is:

1. A charge detecting apparatus for detecting completion of charging of a secondary battery in which an electrolyte is used, said apparatus comprising:

bubbling sound detecting means for picking up bubbling sounds produced inside a secondary battery, and converting the bubbling sounds into a quantity of electricity, said bubbling sound detecting means picking up said bubbling sounds externally of a container of said secondary battery; and bubble quantity checking means for outputting a charge completion signal when a quantity of electricity output from said bubbling sound detecting means reaches a predetermined reference level.

2. An apparatus as claimed in claim 1, wherein said bubbling sound detecting means includes;

a microphone disposed in contact with a peripheral surface of said container for detecting the bubbling sounds, an amplifier for amplifying a detection signal received from said microphone, a filter for selectively allowing passage of frequency components corresponding to the bubbling sounds in the detection signal amplified by said amplifier, rectifying means for rectifying the components having passed through said filter, and smoothing means for smoothing the components having passed through said rectifying means.

3. An apparatus as claimed in claim 2, wherein said bubble quantity checking means includes:

a comparator for comparing a signal smoothed by said smoothing means with a predetermined reference voltage; and a flip-flop circuit having an output reversible in response to a signal received from said comparator, resulting in a reversed output signal, said reversed output signal being used as said charge completion signal.

4. An apparatus as claimed in claim 3, wherein a current supplied to said secondary battery is cut off in response to the charge completion signal of said flip-flop circuit.

5. An apparatus as claimed in claim 3, further comprising an alarm operable in response to the charge completion signal of said flip-flop circuit.

* * * * *